(12) United States Patent
Yao et al.

(10) Patent No.: US 9,230,684 B2
(45) Date of Patent: Jan. 5, 2016

(54) MEMORY CONTROLLER, STORAGE DEVICE, AND MEMORY CONTROL METHOD

(71) Applicant: KABUSHIKI KAISHA TOSHIBA, Minato-ku (JP)

(72) Inventors: Hiroshi Yao, Kanagawa (JP); Shinichi Kanno, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 234 days.

(21) Appl. No.: 13/953,885

(22) Filed: Jul. 30, 2013

(65) Prior Publication Data

US 2014/0169091 A1    Jun. 19, 2014

Related U.S. Application Data

(60) Provisional application No. 61/739,493, filed on Dec. 19, 2012.

(51) Int. Cl.
| | |
|---|---|
| *G11C 29/00* | (2006.01) |
| *G11C 29/04* | (2006.01) |
| *G11C 29/42* | (2006.01) |
| *G06F 11/10* | (2006.01) |
| *G06F 13/16* | (2006.01) |

(52) U.S. Cl.
CPC ............ *G11C 29/04* (2013.01); *G06F 11/1068* (2013.01); *G11C 29/42* (2013.01); *G06F 13/1694* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 5,682,346 | A  * | 10/1997 | Yamamura et al. | 365/185.18 |
| 8,626,989 | B2 * | 1/2014 | Van Aken | 711/103 |
| 2008/0270682 | A1* | 10/2008 | Lasser et al. | 711/103 |
| 2010/0251075 | A1 | 9/2010 | Takahashi et al. | |
| 2011/0026353 | A1* | 2/2011 | Mokhlesi | 365/222 |
| 2011/0239083 | A1 | 9/2011 | Kanno | |
| 2012/0224423 | A1* | 9/2012 | Gurgi et al. | 365/185.03 |
| 2013/0104002 | A1* | 4/2013 | Hara et al. | 714/763 |

FOREIGN PATENT DOCUMENTS

| | | | |
|---|---|---|---|
| JP | 2006-031813 | A | 2/2006 |
| JP | 2009-211209 | A | 9/2009 |
| JP | 2010-237822 | A | 10/2010 |
| JP | 2011-203878 | A | 10/2011 |
| JP | 2013-131095 | A | 7/2013 |
| JP | 2014-134843 | | 7/2014 |

* cited by examiner

*Primary Examiner* — M. Mujtaba K Chaudry
(74) *Attorney, Agent, or Firm* — Oblon, McClelland, Maier & Neustadt, L.L.P.

(57) ABSTRACT

According to one embodiment, a memory controller controlling a NAND memory having D bits/cell, includes: a code encoder which generates a code word having correction capability of t symbols; a write control unit which controls writing of the code word to the NAND memory; and a code decoder which decodes the code word read from the NAND memory, wherein the write control unit dispersedly allocates 2×D pages stored in adjacent two word lines in a block of the NAND memory to 2×D/t or more code words.

9 Claims, 14 Drawing Sheets

FIG.4

| WL | | CODE | SYMBOL | |
|---|---|---|---|---|
| 0 | L | 0 | 0 | |
| 0 | M | 0 | 1 | |
| 0 | U | 0 | 2 | |
| 1 | L | 0 | 3 | |
| 1 | M | 0 | 4 | |
| 1 | U | 0 | 5 | |
| 2 | L | 0 | 6 | |
| 2 | M | 0 | 7 | |
| 2 | U | 0 | 8 | |
| 3 | L | 0 | 9 | |
| 3 | M | 0 | 10 | |
| 3 | U | 0 | 11 | |
| ⋮ | | ⋮ | ⋮ | |
| 20 | L | 0 | 60 | |
| 20 | M | 0 | 61 | |
| 20 | U | 0 | 62 | P |
| 21 | L | 0 | 63 | P |
| 21 | M | 1 | 0 | |
| 21 | U | 1 | 1 | |
| ⋮ | | ⋮ | ⋮ | |
| 62 | L | 2 | 58 | |
| 62 | M | 2 | 59 | |
| 62 | U | 2 | 60 | |
| 63 | L | 2 | 61 | |
| 63 | M | 2 | 62 | P |
| 63 | U | 2 | 63 | P |

L: Lower PAGE
M: Middle PAGE
U: Upper PAGE

FIG.6

| WL | | CODE | SYMBOL | |
|---|---|---|---|---|
| 0 | L | 0 | 0 | |
| 0 | U | 0 | 1 | |
| 1 | L | 1 | 0 | |
| 1 | U | 1 | 1 | |
| 2 | L | 0 | 2 | |
| 2 | U | 0 | 3 | |
| 3 | L | 1 | 2 | |
| 3 | U | 1 | 3 | |
| 4 | L | 0 | 4 | |
| 4 | U | 0 | 5 | |
| 5 | L | 1 | 4 | |
| 5 | U | 1 | 5 | |

CORRECTION CAN BE MADE BY USING TWO CODE WORDS ALTHOUGH FOUR SYMBOLS ARE LOST DUE TO DEFECT OCCURRING IN ADJACENT WLS

| WL | | CODE | SYMBOL | |
|---|---|---|---|---|
| 60 | L | 0 | 60 | |
| 60 | U | 0 | 61 | |
| 61 | L | 1 | 60 | |
| 61 | U | 1 | 61 | |
| 62 | L | 0 | 62 | P |
| 62 | U | 0 | 63 | P |
| 63 | L | 1 | 62 | P |
| 63 | U | 1 | 63 | P |

FIG.7

| WL | | CODE | SYMBOL | |
|----|---|------|--------|---|
| 0  | L | 0 | 0 | |
|    | U | 1 | 0 | |
| 1  | L | 0 | 1 | |
|    | U | 1 | 1 | |
| 2  | L | 0 | 2 | |
|    | U | 1 | 2 | |
| 3  | L | 0 | 3 | |
|    | U | 1 | 3 | |
| 4  | L | 0 | 4 | |
|    | U | 1 | 4 | |
| 5  | L | 0 | 5 | |
|    | U | 1 | 5 | |
| ⋮  |   | ⋮ |   | |
| 60 | L | 0 | 60 | |
|    | U | 1 | 60 | |
| 61 | L | 0 | 61 | |
|    | U | 1 | 61 | |
| 62 | L | 0 | 62 | P |
|    | U | 1 | 62 | P |
| 63 | L | 0 | 63 | P |
|    | U | 1 | 63 | P |

FIG.8

| WL | | CODE | SYMBOL | |
|---|---|---|---|---|
| 0 | L | 0 | 0 | |
|   | U | 1 | 0 | |
| 1 | L | 1 | 1 | |
|   | U | 0 | 1 | |
| 2 | L | 0 | 2 | |
|   | U | 1 | 2 | |
| 3 | L | 1 | 3 | |
|   | U | 0 | 3 | |
| 4 | L | 0 | 4 | |
|   | U | 1 | 4 | |
| 5 | L | 1 | 5 | |
|   | U | 0 | 5 | |
| ⋮ | | ⋮ | ⋮ | |
| 60 | L | 0 | 60 | |
|    | U | 1 | 60 | |
| 61 | L | 1 | 61 | |
|    | U | 0 | 61 | |
| 62 | L | 0 | 62 | P |
|    | U | 1 | 62 | P |
| 63 | L | 1 | 63 | P |
|    | U | 0 | 63 | P |

FIG.9

| Page | WL | | CODE | SYMBOL | |
|------|----|----|------|--------|----|
| 0 | 0 | L | 0 | 0 | |
| 1 | 1 | L | 1 | 0 | |
| 2 | 0 | U | 1 | 1 | |
| 3 | 2 | L | 0 | 1 | |
| 4 | 1 | U | 0 | 2 | |
| 5 | 3 | L | 1 | 2 | |
| 6 | 2 | U | 1 | 3 | |
| 7 | 4 | L | 0 | 3 | |
| 8 | 3 | U | 0 | 4 | |
| 9 | 5 | L | 1 | 4 | |
| 10 | 4 | U | 1 | 5 | |
| 11 | 6 | L | 0 | 5 | |

⋮

| Page | WL | | CODE | SYMBOL | |
|------|----|----|------|--------|----|
| 120 | 59 | U | 0 | 60 | |
| 121 | 61 | L | 1 | 60 | |
| 122 | 60 | U | 1 | 61 | |
| 123 | 62 | L | 0 | 61 | |
| 124 | 61 | U | 0 | 62 | P |
| 125 | 63 | L | 1 | 62 | P |
| 126 | 62 | U | 1 | 63 | P |
| 127 | 63 | U | 0 | 63 | P |

FIG.10

| WL | | CODE | SYMBOL | |
|---|---|---|---|---|
| 0 | L | 0 | 0 | |
| 0 | M | 0 | 1 | |
| 0 | U | 1 | 0 | |
| 1 | L | 1 | 1 | |
| 1 | M | 2 | 0 | |
| 1 | U | 2 | 1 | |
| 2 | L | 0 | 2 | |
| 2 | M | 0 | 3 | |
| 2 | U | 1 | 2 | |
| 3 | L | 1 | 3 | |
| 3 | M | 2 | 2 | |
| 3 | U | 2 | 3 | |
| 4 | L | 0 | 4 | |
| 4 | M | 0 | 5 | |
| 4 | U | 1 | 4 | |
| 5 | L | 1 | 5 | |
| 5 | M | 2 | 4 | |
| 5 | U | 2 | 5 | |
| ⋮ | | ⋮ | | |
| 60 | L | 0 | 60 | |
| 60 | M | 0 | 61 | |
| 60 | U | 1 | 60 | |
| 61 | L | 1 | 61 | |
| 61 | M | 2 | 60 | |
| 61 | U | 2 | 61 | |
| 62 | L | 0 | 62 | P |
| 62 | M | 0 | 63 | P |
| 62 | U | 1 | 62 | P |
| 63 | L | 1 | 63 | P |
| 63 | M | 2 | 62 | P |
| 63 | U | 2 | 63 | P |

CORRECTION CAN BE MADE BY USING THREE CODE WORDS ALTHOUGH SIX SYMBOLS ARE LOST DUE TO DEFECT OCCURRING IN ADJACENT WLS

FIG.11

| WL | | CODE | SYMBOL | |
|---|---|---|---|---|
| 0 | L | 0 | 0 | |
| | M | 1 | 0 | |
| | U | 2 | 0 | |
| 1 | L | 0 | 1 | |
| | M | 1 | 1 | |
| | U | 2 | 1 | |
| 2 | L | 0 | 2 | |
| | M | 1 | 2 | |
| | U | 2 | 2 | |
| 3 | L | 0 | 3 | |
| | M | 1 | 3 | |
| | U | 2 | 3 | |
| 4 | L | 0 | 4 | |
| | M | 1 | 4 | |
| | U | 2 | 4 | |
| 5 | L | 0 | 5 | |
| | M | 1 | 5 | |
| | U | 2 | 5 | |
| ⋮ | | ⋮ | | |
| 60 | L | 0 | 60 | |
| | M | 1 | 60 | |
| | U | 2 | 60 | |
| 61 | L | 0 | 61 | |
| | M | 1 | 61 | |
| | U | 2 | 61 | |
| 62 | L | 0 | 62 | P |
| | M | 1 | 62 | P |
| | U | 2 | 62 | P |
| 63 | L | 0 | 63 | P |
| | M | 1 | 63 | P |
| | U | 2 | 63 | P |

FIG.12

| WL | | CODE | SYMBOL | |
|---|---|---|---|---|
| 0 | L | 0 | 0 | |
| | M | 1 | 0 | |
| | U | 2 | 0 | |
| 1 | L | 1 | 1 | |
| | M | 2 | 1 | |
| | U | 0 | 1 | |
| 2 | L | 2 | 2 | |
| | M | 0 | 2 | |
| | U | 1 | 2 | |
| 3 | L | 0 | 3 | |
| | M | 1 | 3 | |
| | U | 2 | 3 | |
| 4 | L | 1 | 4 | |
| | M | 2 | 4 | |
| | U | 0 | 4 | |
| 5 | L | 2 | 5 | |
| | M | 0 | 5 | |
| | U | 1 | 5 | |
| ⋮ | | ⋮ | | |
| 60 | L | 1 | 60 | |
| | M | 2 | 60 | |
| | U | 0 | 60 | |
| 61 | L | 2 | 61 | |
| | M | 0 | 61 | |
| | U | 1 | 61 | |
| 62 | L | 0 | 62 | P |
| | M | 1 | 62 | P |
| | U | 2 | 62 | P |
| 63 | L | 1 | 63 | P |
| | M | 2 | 63 | P |
| | U | 0 | 63 | P |

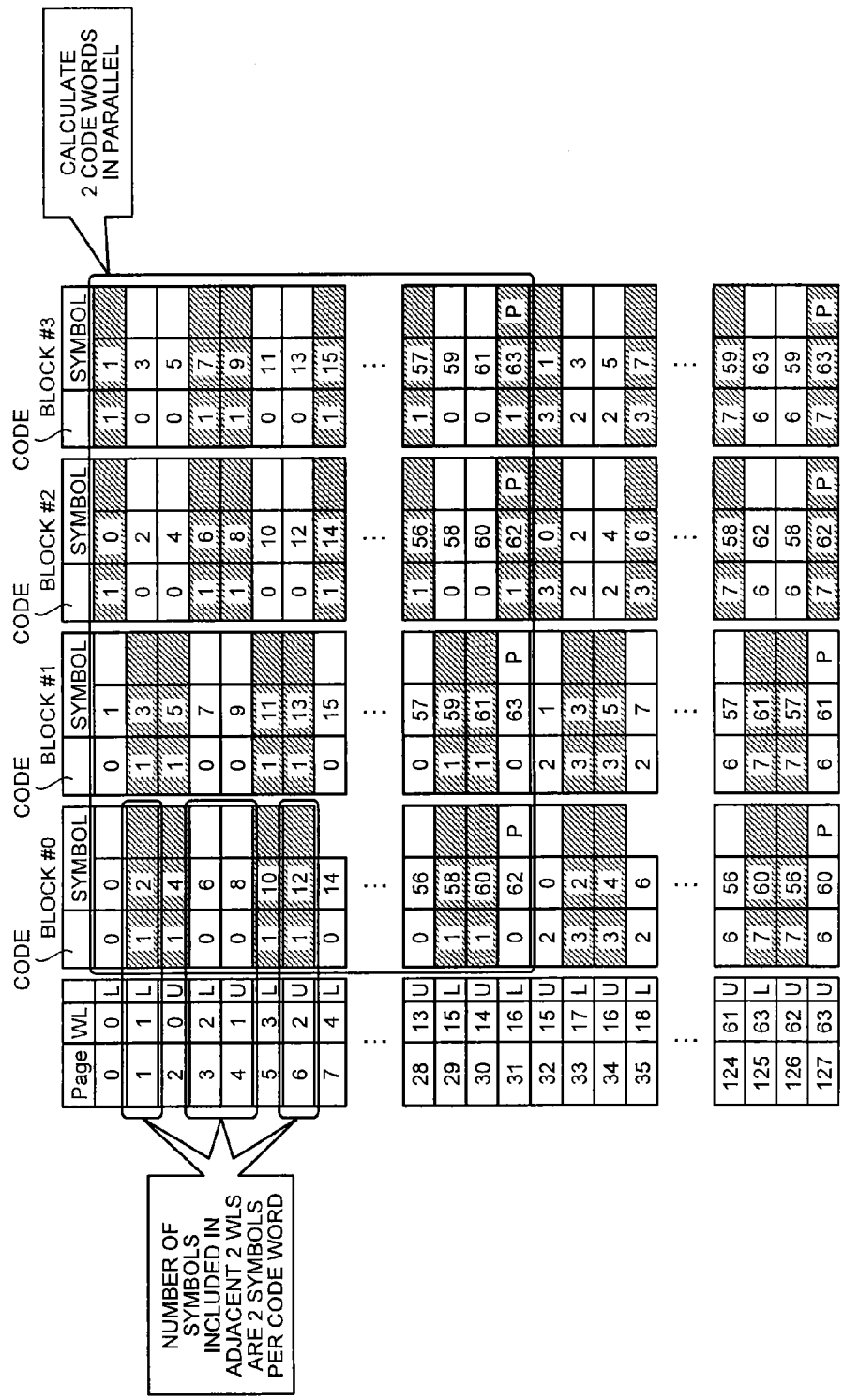

MEMORY CONTROLLER, STORAGE DEVICE, AND MEMORY CONTROL METHOD

CROSS-REFERENCE TO RELATED APPLICATIONS

This application is based upon and claims the benefit of priority from Provisional Patent Application No. 61/739,493, filed on Dec. 19, 2012; the entire contents of which are incorporated herein by reference.

FIELD

Embodiments described herein relate generally to a memory controller, a storage device, and a memory control method.

BACKGROUND

In a storage device using a NAND flash memory (NAND memory), error correction (Error Check and Correct) is performed, and a data which is to be written in the NAND memory is encoded to be written in each page of the NAND memory. As error correction process, there is an inner-page ECC (Error Check and Correct) where one code word is configured with symbols in the same page and an inter-page ECC where one code word is configured with symbol in different pages. In a case where random error is beyond correction capability (error-correctable number of symbols) of the inner-page ECC, or in a case where burst error, that is, data loss in unit of a page occurs due to circuit disorder, the error can be corrected by using the inter-page ECC.

BRIEF DESCRIPTION OF THE DRAWINGS

FIG. 4 is a diagram illustrating an example of a configuration of code words of an inter-page ECC in the case of 3 bits/cell;

FIG. 6 is a diagram illustrating an example of a configuration of code words according to the first embodiment in the case of using 2 bits/cell;

FIG. 7 is a diagram illustrating an example of a configuration of code words according to the first embodiment in the case of using 2 bits/cell;

FIG. 8 is a diagram illustrating an example of a configuration of code words according to the first embodiment in the case of using 2 bits/cell;

FIG. 9 is a diagram illustrating an example of a configuration of code words in the case where a writing order is different from an order indicating physical page positions;

FIG. 10 is a diagram illustrating an example of a configuration of code words according to the first embodiment in the case of using 3 bits/cell;

FIG. 11 is a diagram illustrating an example of a configuration of code words according to the first embodiment in the case of using 3 bits/cell;

FIG. 12 is a diagram illustrating an example of a configuration of code words according to the first embodiment in the case of using 3 bits/cell;

FIG. 14 is a diagram illustrating an example of a configuration of code words according to the second embodiment.

DETAILED DESCRIPTION

In general, according to one embodiment, there is provided a memory controller controlling a NAND memory having D bits/cell, including: a code encoder which generates a code word having correction capability of t symbols; a write control unit which controls writing of the code word to the NAND memory; and a code decoder which decodes the code word read from the NAND memory, wherein the write control unit dispersedly allocates 2×D pages stored in adjacent two word lines in a block of the NAND memory to 2×D/t or more code words.

Exemplary embodiments of a memory controller, a storage device, and a memory control method will be explained below in detail with reference to the accompanying drawings. The present invention is not limited to the following embodiments.

First Embodiment

Figure 1:
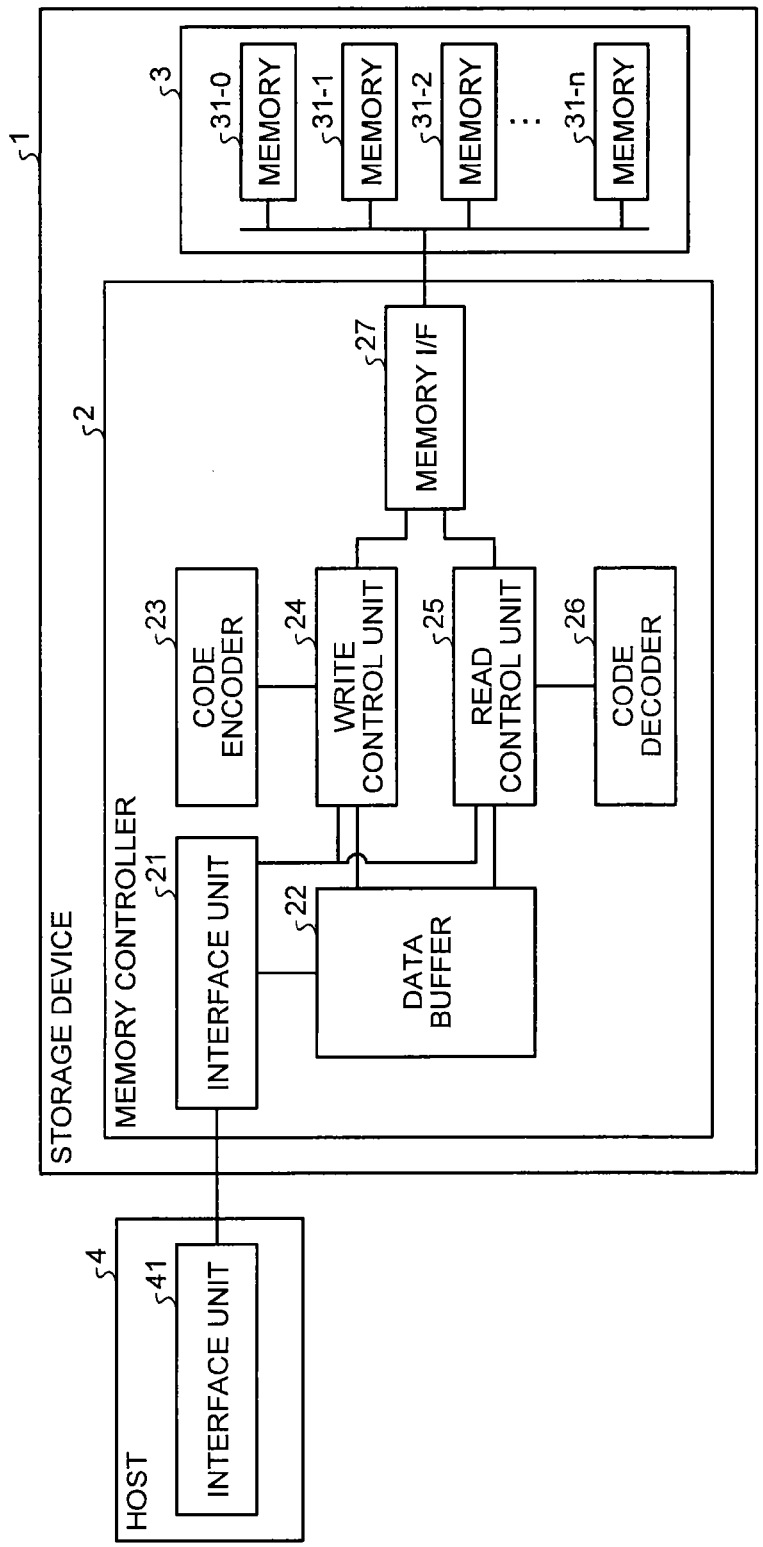
FIG. 1 is a block diagram illustrating an example of a configuration of a storage device according to a first embodiment.

FIG. 1 is a block diagram illustrating an example of a configuration of a storage device 1 according to a first embodiment. A storage device 1 is configured to include a memory controller 2 and a NAND memory (non-volatile memory) 3. The storage device 1 can be connected to a host 4. FIG. 1 illustrates a state where the storage device 1 is connected to the host 4. The host 4 is, for example, an electronic apparatus such as a personal computer or a mobile terminal.

The NAND memory 3 is a non-volatile memory which stores a data in a non-volatile manner and is configured to include n (n is an integer of 0 or more)+1 memory chips (memories) 31-0 to 31-n. The memory 31-k denotes a k-th memory chip. Herein, although an example of using the NAND memory 3 as a NAND memory is described, a storage unit other than the non-volatile memory may be used. In a NAND memory, a unit of writing (minimum writing) generally referred to as a page exists, and writing is performed in unit of a page.

The memory controller 2 controls writing to the NAND memory 3 according to a write command (request) from the host 4 and controls reading from the NAND memory 3 according to a read command (request) from the host 4. The memory controller 2 is configured to include an interface unit 21, a data buffer 22, a code encoder 23, a write control unit 24, a read control unit 25, a code decoder 26, and a memory interface (I/F) 27.

The interface unit 21 is connected to an interface unit 41 of the host 4 through a communication line to perform transmission process or the like between the host 4 and the storage device 1 according to a type or a specification of the communication line. The communication line is, for example, a serial bus such as SATA (Serial Advanced Technology Attachment) or an address bus and a data bus. The interface unit 21 receives the read command or the write command from the host 4 and receives an address or a size of a data which is to be transmitted according to the command. Next, the interface unit 21 secures a necessary buffer region on the data buffer 22 and notifies a process of the command to the write control unit 24 or the read control unit 25. In addition, the interface unit 21 receives a write data for the NAND memory 3 from the host 4 to store the write data in the data buffer 22 and transmits a read data which is read from the NAND memory 3 to be stored in the data buffer 22 to the host 4.

The data buffer 22 is a memory used for temporarily storing the data received from the host 4 until the memory controller 2 stores the data in the NAND memory 3 or temporarily storing the data read from the NAND memory 3 until the memory controller 2 transmits the data to the host 4. For example, the data buffer 22 is configured with a general-purpose memory such as an SRAM (static random access memory) or a DRAM (dynamic random access memory).

The write control unit 24 controls the process of writing the write data stored in the data buffer 22 to the NAND memory 3. More specifically, the write control unit 24 determines the region on the NAND memory 3 where the data (write data) on the data buffer 22 is to be written, reads the data from the data buffer 22, and transmits the data to the code encoder 23. In addition, the write control unit 24 determines the region on the NAND memory 3 where the symbols of the code generated by the code encoder 23 are to be written and transmits the data and the code to the memory I/F 27.

The code encoder 23 performs an error correction coding process based on the data transmitted from the write control unit 24 to generate a redundant symbol (generates an error correction code). Herein, although the process is configured to be performed on both of the inner-page ECC generated based on the data in the same page and the inter-page ECC generated based on the data in plural pages, the process may not be performed on the inner-page ECC. Any code may be used as the error correction code of the inner-page ECC. For example, a BCH code may be used. Any code may be used as the error correction code of the inter-page ECC. For example, an RS (Reed-Solomon) code, an XOR parity code, or the like may be used. The type of the error correction code is not limited. In the description hereinafter, an example where an RS code is used as an inter-page ECC will be described.

The memory I/F 27 is a controller which directly controls writing or reading with respect to the NAND memory 3. The memory I/F 27 transmits the write data transmitted from the write control unit 24 to the NAND memory 3 and commands the NAND memory 3 to write the write data in a write region determined by the write control unit 24. In addition, the memory I/F 27 reads the data of which reading is commanded by the read control unit 25 from the NAND memory 3 and transmits the data to the read control unit 25.

The read control unit 25 controls a process of reading a read-requested data (read object data) from the NAND memory 3 according to a read command of the host 4 issued through the interface unit 21. The read control unit 25 stores the data read from the NAND memory 3 in the data buffer 22 and transmits the data to the code decoder 26.

The code decoder 26 performs a decoding process based on the data (symbol) transmitted from the read control unit 25. In the case where the error is corrected, the code decoder 26 transmits the error-corrected read data to the read control unit 25. More specifically, first, the code decoder 26 performs decoding an inner-page ECC. In the case where the error is corrected, the code decoder 26 transmits the error-corrected read data to the read control unit 25. In the case where the code decoder 26 fails in the error correction using the inner-page ECC, the code decoder 26 performs decoding an inter-page ECC and transmits the error-corrected read data to the read control unit 25.

In the case where the error is corrected by the code decoder 26, the read control unit 25 stores the error-corrected read data in the data buffer 22.

Figure 2:
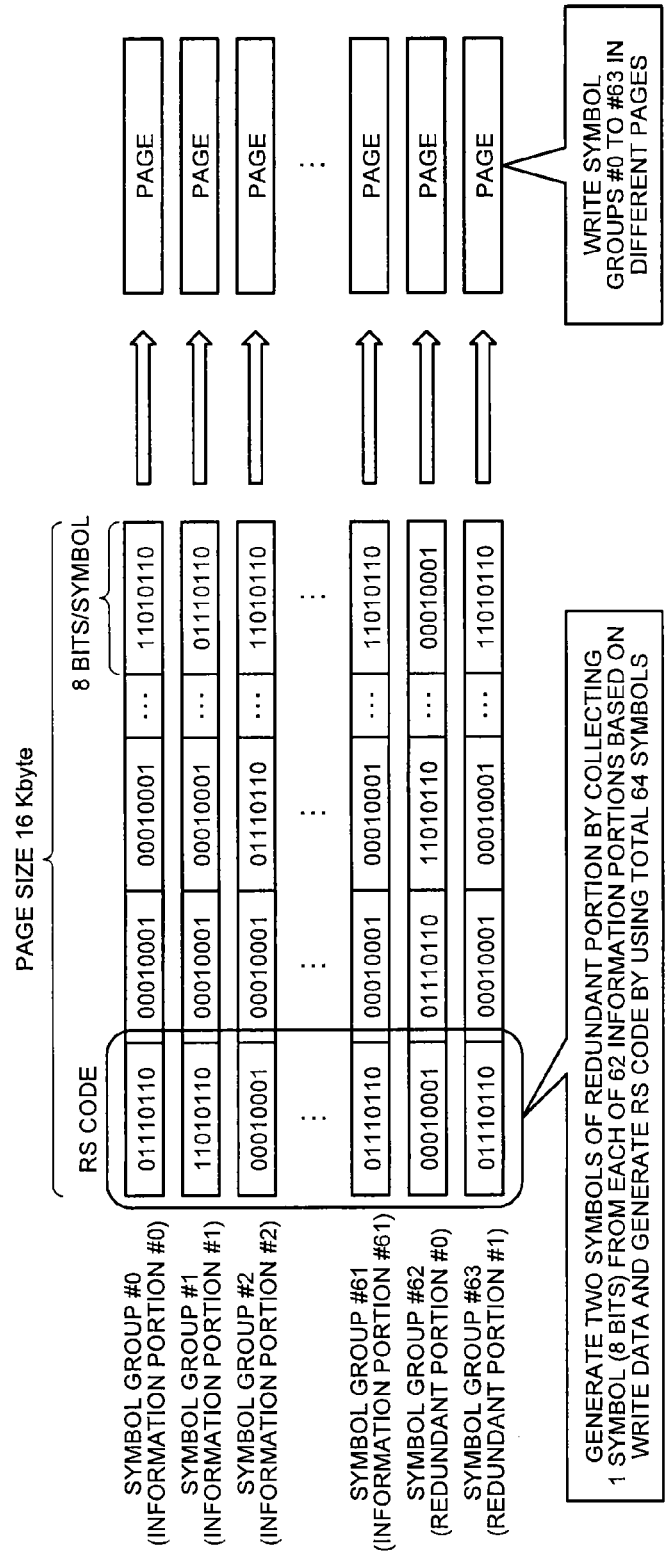
FIG. 2 is a diagram illustrating an example of a configuration of code words of an inter-page ECC.

The inter-page ECC will be described. In the case of using an NAND memory, if an inter-page ECC where one code is configured with symbols of different pages is applied, there is an advantage in that, even in the case where defect in unit of a page occurs, a data can be recovered. FIG. 2 is a diagram illustrating an example of a configuration of code words of an inter-page ECC. FIG. 2 illustrates an example where the number of information symbols is 62, the number of redundant symbols is 2, the number of code symbols (information symbols+redundant symbols) is 64, a symbol length is 8 bits, and a page size is 16 K bytes. Each of the symbol groups #0 to #63 is set as the symbol group corresponding to each page size, and one code word is generated by one symbol of each of the symbol groups #0 to #63. Next, the symbol groups #0 to #63 are written in different pages on the NAND memory. Therefore, one code word can be configured with the symbols of different pages.

Figure 3:
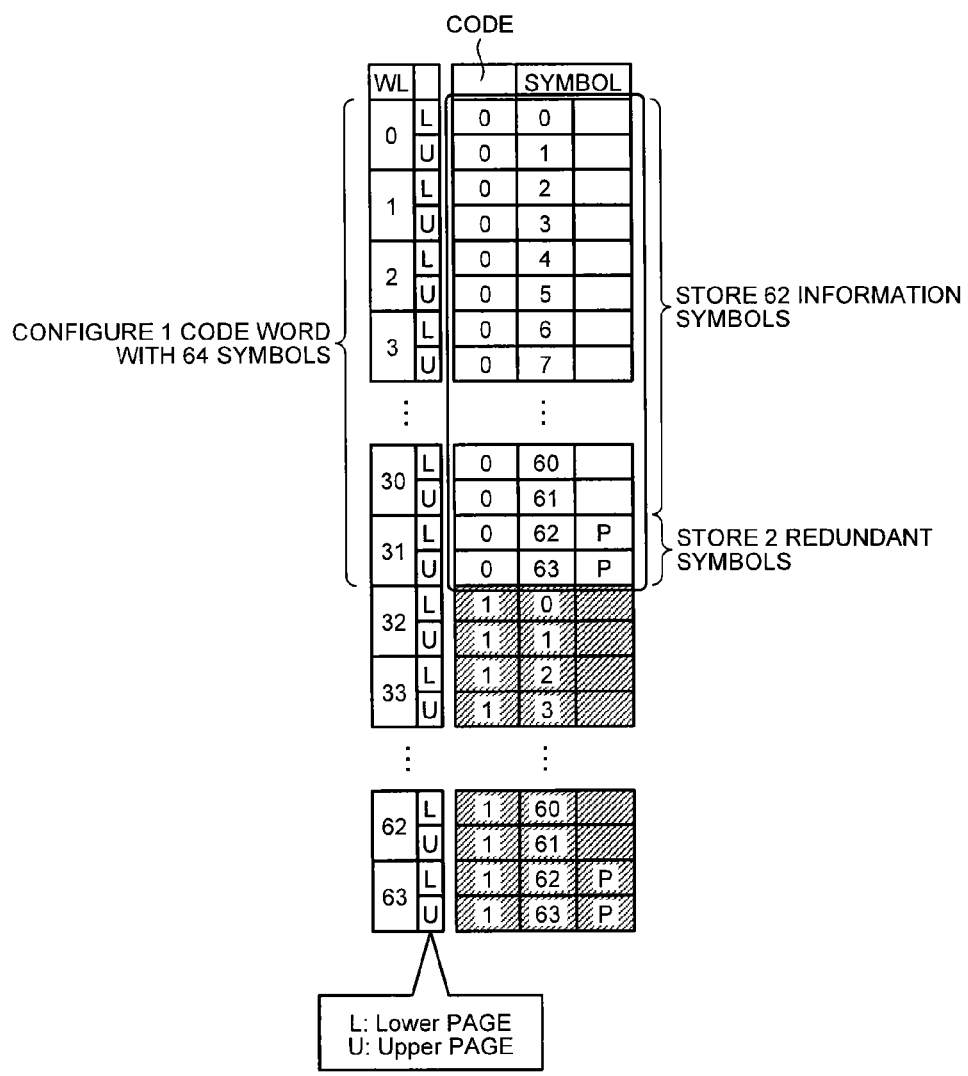
FIG. 3 is a diagram illustrating an example of a configuration of code words of an inter-page ECC in the case of 2 bits/cell.

In the inter-page ECC of the related art, as arrangement of symbols constituting one code word, there is a case where one code word is arranged to be distributed to plural pages in the same block and a case where one code word is arranged to be distributed to pages in plural blocks. FIGS. 3 and 4 are diagrams illustrating examples of configurations of code words of an inter-page ECC. In FIG. 3, in the case of 2 bits/cell, an RS code (64, 62) (RS code having 64 code symbols and 62 information symbols) is used. The one code word (code word #0) is configured with one symbol of L (Lower) page of WL#0, one symbol of U (Upper) page of WL#0, one symbol of L page of WL#1, one symbol of U page of WL#1, . . . , one symbol of L page of WL#31, and one symbol of U page of WL#31; and the other code word (code word #1) is configured with one symbol of L (Lower) page of WL#32, one symbol of U (Upper) page of WL#32, one symbol of L page of WL#33, one symbol of U page of WL#33, . . . , one symbol of L page of WL#63, and one symbol of U page of WL#63. The second rightmost column represented by "code" in FIG. 3 denotes the code word number, and the same number denotes configuring the same code word. The rightmost column represented by "Symbol" in FIG. 3 denotes the symbol number in the code word.

In FIG. 4, in the case of 3 bits/cell, an RS code (64, 62) is used. The one code word (code word #0) is configured with one symbol of L page of WL#0, one symbol of M (Middle) page of WL#0, one symbol of U page of WL#0, one symbol of L page of WL#1, one symbol of M page of WL#1, one symbol of U page of WL#1, . . . , and one symbol of L page of WL#21. In addition, the code word #1 is configured with symbols of consecutive 64 pages from the M page of the WL#21; and the code word #2 is configured with symbols of next consecutive 64 pages. As illustrated in FIGS. 3 and 4, one code word is configured with symbols of consecutive 64 pages in a block.

As illustrated in FIGS. 3 and 4, in the case where an inter-page ECC where one code is configured with symbols of consecutive pages in a block is applied, if correction capability is configured to cope with defect of one WL, even in the case of defect in unit of WL, the data can be recovered. However, in the case where the correction capability is configured to cope with one WL, the correction capability cannot cope with defect of two WLs. For example, in the case of defect where physically consecutive two WLs are short-circuited, the data of two WLs are lost. In the case where correction capability is configured to cope with defect of two WLs, the correction capability is increased, so that a ratio of redundant symbols is increased. For example, in the case of the example of FIG. 3, the correction capability is two symbols, so that the data can be recovered even in the case where defect of one WL occurs. However, in the case where defect occurs in two WLs, four symbols are lost, so that correction cannot be made. The error correction capability represents the maximum number of erroneous symbols which can be corrected by the decoding. When a code word has correction capability of t symbols, it is possible to correct t erroneous symbols. In other words, "code word having correction capability of t symbols" means that t erroneous symbols can be corrected by the decoding.

Figure 5:
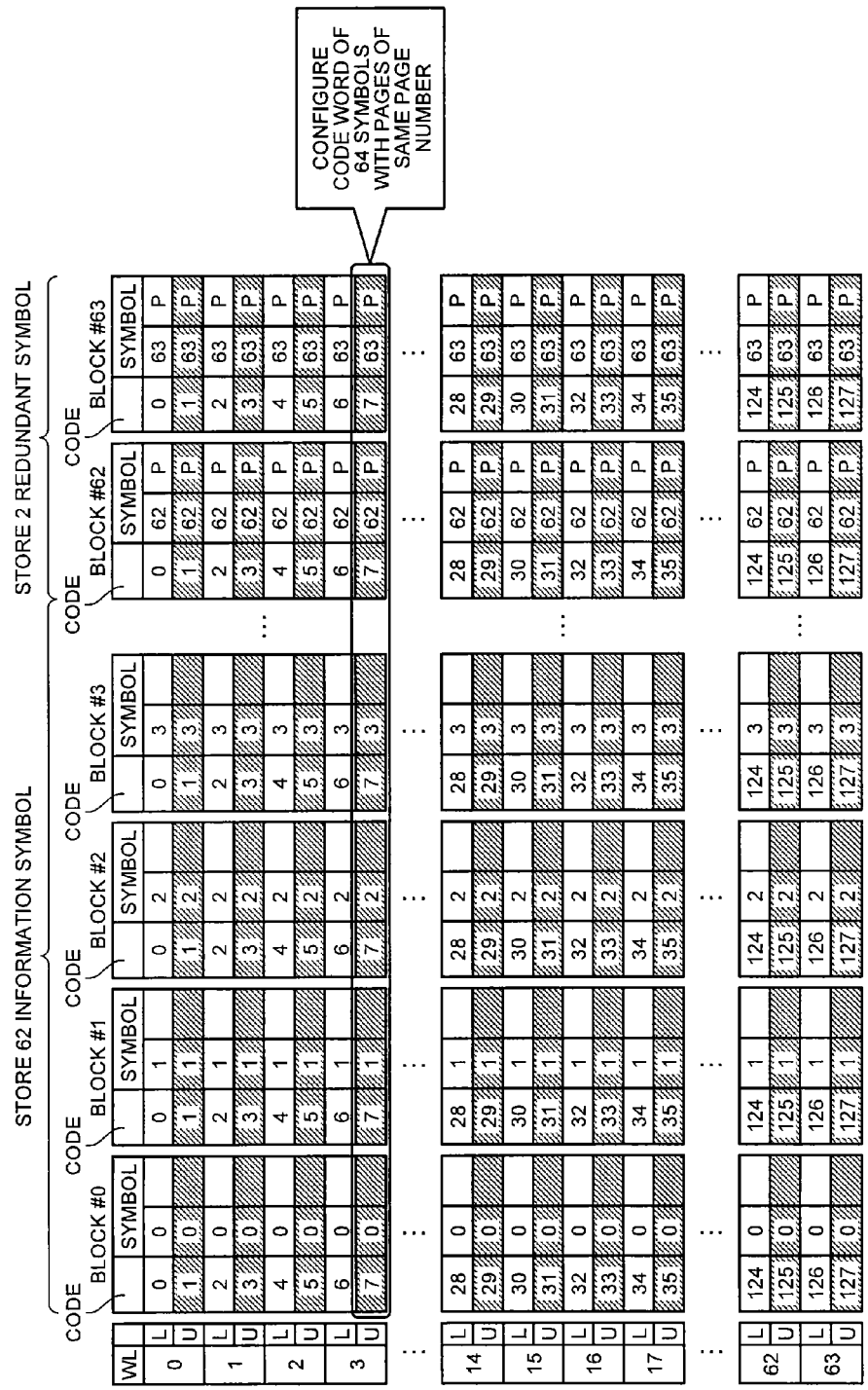
FIG. 5 is a diagram illustrating an example of arrangement in the case where one code word is arranged to be distributed to pages in plural blocks.

According to the method where the code word is arranged to be distributed to pages in plural blocks, even in the case where defect occurs in two WLs in the same block, correction can be made. FIG. 5 is a diagram illustrating an example of arrangement in the case where one code word is arranged to be distributed to pages in plural blocks. FIG. 5 illustrates an example where, in the case of 2 bits/cell, an RS code (64, 62) is used and one code word is configured over 64 blocks (BLOCK #0 to BLOCK #63) in a NAND memory. In FIG. 5, one code word is configured with symbols of pages having the same page number in the BLOCK #0 to BLOCK #63.

In this case, even in the case where defect occurs in adjacent two WL in a block, since the four pages which are included in the WLs are included in different code words, only one symbol per code word is lost. Therefore, even in the case where the correction capability is configured to cope with one WL, correction can be made. However, if some blocks in a set of the 64 blocks BLOCK #0 to BLOCK #63 are erased, one code word is not configured. Therefore, in the case where some blocks among the 64 blocks BLOCK #0 to BLOCK #63 is used for writing a new data, all the valid data written in the blocks need to be moved to other new 64 blocks, and after that, the original blocks need to be erased. In this manner, in the case where one code word is arranged to be distributed to pages in plural blocks, extra blocks for rewriting are prepared. For example, in the case where the block size is 1 MB, 64 MB is needed as blocks for writing. Therefore, there is a problem in that the extra capacity of the NAND memory necessary for operation is increased. Although the number of blocks in a set may be decreased by reducing a code length, since the ratio of redundant symbol is increased in this case, the capacity necessary for operation is increased.

In the embodiment, the code word is configured as described below so that it is possible to recover a data even in the case where defect occurs in adjacent two WLs while suppressing the extra capacity of the NAND memory necessary for operation.

FIGS. 6 to 9 are diagrams illustrating examples of configurations of code words according to the embodiment in the case of using 2 bits/cell. Similarly to FIG. 3, in all the examples of FIGS. 6 to 9, the RS code (64, 62) is used, and the correction capability is configured to cope with one WL. In addition, herein, although the examples using the RS code (64, 62) are described, the type and length of the code are not limited thereto. In addition, in FIGS. 6 to 9, although only the first symbol of each page is illustrated, the code word is configured similarly with respect to the other symbols.

In the example of FIG. 6, two pages of one WL is allocated to the same code word, and adjacent WLs are alternately allocated to different code words. In the example of FIG. 6, the code word #0 is configured with symbols of two pages of even-numbered WLs, and the code word #1 is configured with symbols of two pages of odd-numbered WLs. In addition, the symbols represented by P in the figure denote redundant symbols.

In the example of FIG. 7, two pages of one WL are allocated to different code words. For example, the code word #0 is configured with symbols of L pages, and the code word #1 is configured with symbols of U pages.

In the example of FIG. 8, two pages of one WL are allocated to different code words, and different types of pages (U page, L page) are included in one code word. For example, the symbol of L page of WL#1 and the symbol of U page of WL#2 constitute the code word #1, and the symbol of U page of WL#1 and the symbol of L page of WL#2 constitute the code word #0.

As illustrated in FIGS. 6 to 8, four pages included in adjacent WLs are allocated to different code words in unit of two pages, so that, even in the case where defect occurs in two adjacent WLs, correction can be made by using a code having correction capability coping with one WL. In addition, in many cases, since probabilities of occurrence of error are different according to types (U page, L page) of pages, if one code word is configured to include different types of pages similarly to FIG. 8, the number of errors can be equalized.

In the case where an order indicating physical storage positions on the NAND memory 3 is different from a writing order, the code word is configured based on the order indicating the physical storage positions on the NAND memory 3. This configuration is provided in order to allow correction to be made when defect occurs in physically adjacent two WLs on the NAND memory 3.

FIG. 9 illustrates an example of a configuration of code words in the case where the writing order is different from the order indicating physical page positions. The leftmost column represented by "Page" in FIG. 9 denotes the page number indicating the writing order. The number in WL is based on the order indicating the physical storage positions on the NAND memory 3. Even in this case, four pages included in the adjacent WLs are allocated to different code words in unit of two pages.

FIGS. 10 to 12 are diagrams illustrating examples of configurations of the code words according to the embodiment in the case of using 3 bits/cell. In all the examples of FIGS. 10 to 12, the RS code (64, 62) is used, and the correction capability (2 symbols) is smaller than the number of symbols corresponding to 1 WL (3 symbols).

In the example of FIG. 10, consecutive two pages are allocated to the same code word, and the code words to which the pages are allocated in unit of two pages are sequentially switched. The L and M pages of WL#2k (k is an integer of 0 or more) may be allocated to the code word #0; the U page of WL#2k and the L page of WL# (2k+1) may be allocated to the code word #1; and the M and U pages of WL# (2k+1) may be allocated to the code word #2. For example, the M page of WL#1 and the U page of WL#1 may be allocated to the code word #2; the L page of WL#2 and the M page of WL#2 may be allocated to the code word #0; and the L page of WL#1 and the U page of WL#2 may be allocated to the code word #1. Therefore, in the case where defect occurs in adjacent two WLs, so that six symbols are lost, the error correction can be performed by using three code words.

In the example of FIG. 11, three pages of one WL are allocated to different code words. The L page of each WL is allocated to the code word #0; the M page of each WL is allocated to the code word #1; and the U page of each WL is allocated to the code word #2.

In the example of FIG. 12, three pages of one WL are allocated to different code words. In addition, the code word to which the L, M, and U pages are allocated is changed in unit of one WL. More specifically, the L page of WL#3k, the U page of WL# (3k+1), and the M page of WL# (3k+2) are allocated to the code word #0; the M page of WL#3k, the L page of WL# (3k+1), and the U page of WL# (3k+2) are allocated to the code word #1; and the U page of WL#3k, the M page of WL# (3k+1), and the L page of WL# (3k+2) are allocated to the code word #2.

The writing operation to the NAND memory 3 according to the embodiment will be described. As described above, at the time of writing to the NAND memory 3, error correction coding is performed on the write data by the code encoder 23. More specifically, the write control unit 24 allocates pages on the to-be-written NAND memory 3 by setting the write data having a size of 1-page information data as one symbol group. At this time, as illustrated in FIGS. 6 to 12, the code word number in which the symbol group is included and the symbol group number in the code word are determined according to the allocated pages. Next, the write control unit 24 transfers the symbol group to the code encoder 23. The code encoder 23 calculates the code word based on the code word number in which the symbol group is included and the symbol group number in the code word and stores the intermediate result of the calculation.

In addition, herein, every time that the number of symbols as an input to the calculation of an inter-page ECC is increased, the code word can be updated by using the intermediate result before the number of symbols is increased. For example, in the case where the code used for the inter-page ECC is an RS code having a symbol length of 8 bits, the symbol group is divided by the symbol length of 8 bits, and syndrome is re-calculated with respect to the RS code corresponding to 8 bits. The re-calculated syndrome is stored as an intermediate result.

Next, the write control unit 24 transfers the symbol group to the memory I/F 27 so as to write the symbol group in the allocated page. If all the information symbol groups included in the code words are input and the redundant symbol groups of the code words are generated by the code encoder 23, the write control unit 24 transfers the redundant symbol groups to the memory I/F 27 at the writing timing of pages which can be allocated to the redundant symbol group corresponding to t pages.

In the case of using an inner-page ECC, before the information symbol groups and the redundant symbol groups are transferred to the memory I/F 27, the code encoder 23 encodes each symbol group according to the inner-page ECC. In addition, in the case where the symbol group is encoded according to the inter-page ECC and is further encoded according to the inner-page ECC to be transferred to the memory I/F, the encoded symbol group may be directly transferred from the code encoder 23 to the memory I/F, or the encoded symbol group may be transferred through a data buffer to the memory I/F.

As a method of obtaining the code word number in which the symbol group is included and the symbol group number in the code word from the page number allocated to the symbol group, for example, the write control unit 24 may store the correspondence among the page number, the code word number, and the symbol group number in the code word as a table or may obtain the code word number and the symbol group number in the code word from the page number through calculation.

FIGS. 6 to 12 illustrate the cases where one block is written when the writing is performed up to the redundant symbol group in the code words. However, in the case where the number of pages per block is large and the writing does not reach the last page of the one block even when the writing is performed up to the redundant symbol group in the code words, the same allocation is repeated as a new set of code words up to the last page of the block. For example, in FIG. 6, in the case where the number of pages per block is 256 pages, 64*2 code words are used for two sets of 0 to 127 pages and 128 to 256 pages.

The code encoder 23 is configured so as to perform parallel calculation for the number (for example, two in the examples of FIGS. 6 to 9, and three in the examples of FIGS. 10 to 12) of RS codes corresponding to one block. For example, in the example of FIG. 6, regions are installed for storing, for example, the intermediate results for the code word #1 and the code word #2 when the code encoder 23 performs an RS code calculation, and the processes for the code word #1 and the code word #2 are performed while switching the processes. In addition, in the case of the configuration of writing in plural blocks in parallel according to the allocation of the code words according to the embodiment, the code encoder 23 is configured so as to perform parallel calculation for plural blocks.

The reading operation from the NAND memory 3 according to the embodiment will be described. The read control unit 25 inputs the data read from the NAND memory 3 through the memory I/F 27 to the code decoder 26 in unit of a page. The code decoder 26 performs a decoding process on the inner-page ECC. In the case where no error occurs or in the case where error can be corrected, the read data (in the case where no error occurs) or the error-corrected data is transmitted to the host 4. In the case where the error cannot be corrected through the inner-page ECC, the read control unit 25 inputs information symbols and redundant symbols constituting the code word including the data, of which error cannot be corrected, to the code decoder 26. The code decoder 26 performs error correction through the decoding process on the inter-page ECC. In the case where the error correction can be performed, the corrected data is transmitted to the host 4. In addition, in the case where the inner-page ECC is not performed, the decoding process on the inner-page ECC is not performed, but the decoding process on the inter-page ECC is performed.

In the example of the embodiment, the correction capability for one code word is set to two symbols; one block is configured with D (D is a number of stored bits per memory cell) inter-page ECC code words; and symbols of 2×D pages included in adjacent two WLs are distributed to the D code words. The correction capability for one code word is not limited to two symbols, and the number of code words constituting one block is not limited to D. In the case where the correction capability for one code word is set to t symbols, if 2×D pages of adjacent two WLs are allocated to the D×2 t or more code words in unit of t pages or less, even in the case where defect occurs in adjacent two WLs, correction can be made. In addition, if t is set to 2×D or more and the inter-page ECC is performed, although correction can be made in the case where defect occurs in two WLs even in one code word, the size of circuit is increased. On the contrary, in the embodiment, if t<2×D, even in the case where defect occurs in two WLs, correction can be made. Therefore, the size of circuit can be suppressed, so that it is possible to cope with defect simultaneously occurring in adjacent two WLs.

In this manner, in the embodiment, one block is configured with D or more inter-page ECC code words; symbols of 2×D pages included in the adjacent two WLs are distributed to D code words; and the code words are configured so that symbols of two pages among 2×D pages included in adjacent two WLs are included in each code word. Therefore, even in the case where defect simultaneously occurs in adjacent two WLs, the data can be recovered by using the code words having the correction capability which is equal to or less than the correction capability of one WL as symbols constituting one code word. Therefore, the size of circuit can be suppressed, so that it is possible to cope with defect simultaneously occurring in adjacent two WLs.

Second Embodiment

Figure 13:
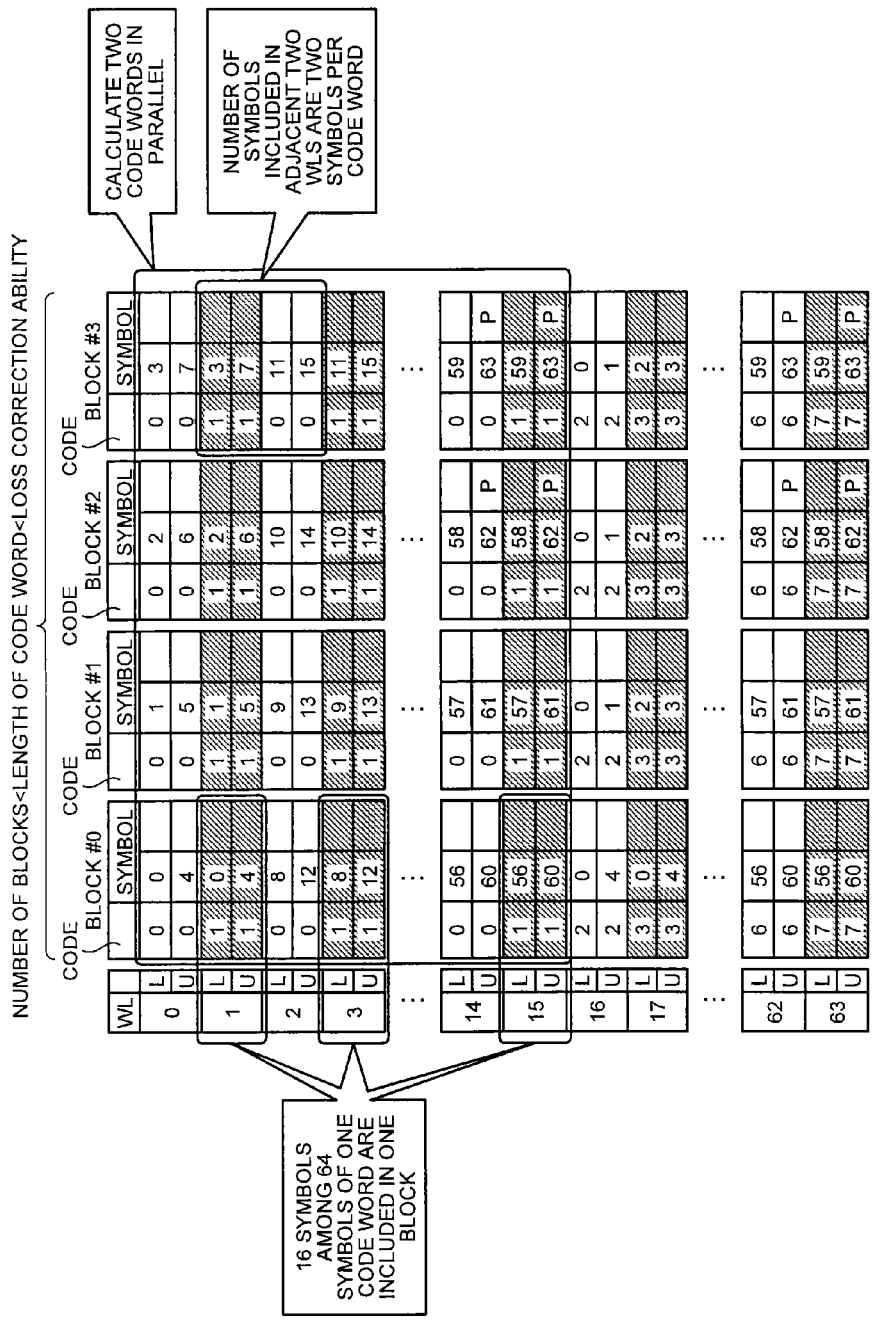
FIG. 13 is a diagram illustrating an example of a configuration of code words according to a second embodiment.

FIG. 13 is a diagram illustrating an example of a configuration of code words according to a second embodiment. In the first embodiment, the example where the inter-page ECC is performed in the same block is described. In the embodiment, the example where the inter-page ECC is performed in plural blocks will be described. The configuration of a storage device according to the embodiment is the same as that of the first embodiment. Hereinafter, components different from those of the first embodiment will be described.

In the inter-page ECC of the related art described with reference to FIG. 5, the necessary extra capacity is increased. In the embodiment, it is configured so that the number of block in a set (the number of blocks constituting one code word) is less than code length. Therefore, the number of blocks in a set is not increased. More specifically, when the code length is defined by n, in the inter-page ECC of the related art described with reference to FIG. 5, the process is performed by configuring n blocks as one set. On the contrary, in the embodiment, when the number of blocks in a set is defined by L, it is configured so that L is smaller than n/t, so that the number of blocks in a set is decreased in comparison with the inter-page ECC of the related art.

In the example of FIG. 13, an RS code (64, 62) is used, and inter-page ECC is performed over four blocks BLOCK #0 to BLOCK #3. The method of allocating the symbols to pages is the same as that of the first embodiment. For example, two pages of one WL are allocated to the same code word, and adjacent WLs are allocated to different code words. In addition, as described in the first embodiment, two pages of one WL may be allocated to different code words, or one code word may be configured with different types of pages. However, in the embodiment, the number of pages which can be allocated to one code word per one block is a value obtained by dividing the code length by the number L (L=4 in the example of FIG. 13) of blocks in a set. In addition, symbols in one block can be allocated to (the number of pages in one block)/(code length/L) code words.

In FIG. 13, similarly to FIG. 6, four pages included in adjacent two WLs are allocated so that two pages of one WL are allocated to the same code word and adjacent WLs are allocated to different code words. In the case of a code length of 64, 16 pages per block are allocated to one code word. In other words, 16 WLs (=32 page) are allocated to two code words.

The order of allocation of pages in a block may be changed block by block. FIG. 14 is a diagram illustrating an example of a configuration of code word in the case where the order of allocation is changed block by block. In FIG. 14, BLOCK #0 and BLOCK #1 have the same order of allocation, but BLOCK #0 and BLOCK #2 have different orders of allocation. For example, in BLOCK #0, the L page of WL#1 may be allocated to the code word #1, but in BLOCK #2, the L page of WL#1 may be allocated to the code word #0. All the blocks may be configured to have different orders of allocation. Also, as illustrated in FIG. 14, some blocks may be configured to have the same order of allocation.

As described in the first embodiment, in the case where the writing order is different from the order indicating the physical storage positions, the configuration of the code word is determined based on the physical storage positions.

Similarly, in the case of 3 bits/cell, the inter-page ECC can be performed over plural blocks.

In the first embodiment, in the case where writing is performed on two or more blocks in parallel, in the calculation of the code encoder 23, encoding calculation of the inter-page ECC corresponding to "(the number of blocks where writing is performed in parallel)×(the number of code words in one block)" is performed in parallel. In the encoding calculation, the intermediate state during the calculation needs to be stored, so that the size is increased in proportion to the number of code words on which calculation is performed in parallel. On the other hand, in the embodiment, the code word is generated by using symbols in plural blocks. Therefore, if the code word is generated over the blocks where writing is performed in parallel, the number of parallel encoding calculations of the inter-page ECC can be reduced. For example, in the case where the code word is generated over four blocks illustrated in FIGS. 13 and 14, the blocks of BLOCK #0 to BLOCK #4 are set to the blocks where writing is performed in parallel. In this case, parallel calculation for two code words may be performed. In the case where writing for four blocks is performed in parallel, in the first embodiment, a memory of 64 KB corresponding to two code words per block and 256 KB corresponding to four blocks is needed. On the contrary, in the embodiment, two code words may be encoded in parallel, and a memory for storing the intermediate state may be 64 KB.

In this manner, in the embodiment, the inter-page ECC is performed over L (L is 2 or more) blocks; symbols of 2×D pages included in adjacent two WLs are distributed to D code words; one block is configured with D×L inter-page ECC code words; and the code words are configured so that symbols of two pages among 2×D pages included in adjacent two WLs are included in each code word. Therefore, even in the case where defect simultaneously occurs in adjacent two WLs, the data can be recovered by using the code words having the correction capability which is equal or less than the correction capability of one WL as symbols constituting one code word. Accordingly, without an increase in extra capacity of the NAND memory 3, it is possible to cope with defect simultaneously occurring in adjacent two WLs.

As described in the first embodiment, the correction capability for one code word is not limited to two symbols, and the number of code words constituting one block is not limited to D×L.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller controlling a NAND memory having D bits/cell where D is an integer of two or more, comprising:
a code encoder which generates a code word having correction capability oft symbols by performing an error correction coding process based on an information data which is to be written in the NAND memory where t is an integer of two or more;
a write control unit which controls writing of the code word to the NAND memory;

a read control unit which controls reading of the code word from the NAND memory;

a code decoder which decodes the code word read from the NAND memory; and a memory interface which performs writing to the NAND memory and reading from the NAND memory, wherein the write control unit writes, in adjacent word lines in a block of the NAND memory, code data to the NAND memory into 2×D different pages for each word line, the data being formed from 2×D/t or more code words, one code word among the 2×D/t or more code words being written to t or less pages among the 2×D pages, the 2×D pages being included in B blocks of the NAND memory, where B is an integer of one or more, wherein N is code length of the code word and greater than t, and B is smaller than N/t, and wherein said code data in the 2×D different pages forms a basis for error correction of the information data.

2. The memory controller according to claim 1, wherein t is less than 2×D.

3. The memory controller according to claim 1, wherein the write control unit controls writing so that the one code word is written to one block of the NAND memory.

4. The memory controller according to claim 1, wherein the code encoder generates an RS code word having a code length of N, the number of information symbols of k, and a symbol length of r bits by performing the error correction coding process, and wherein, a data written to one page of the NAND memory is formed from a plurality of symbols being included in different RS code words.

5. The memory controller according to claim 1, wherein D=2 and t=2, and wherein the write control unit controls writing so that data written to four pages in adjacent two word lines in the block of the NAND memory is formed from a first code word and a second code word, the first code word is written to a first page and a second page among the four pages, and the second code word is written to a third page and a fourth page among the four pages.

6. The memory controller according to claim 1, wherein D=3 and t=2, and wherein the write control unit controls writing so that data written to six pages in adjacent two word lines in the block of the NAND memory is formed from a first code word, a second code word and a third code word, the first code word is written to a first page and a second page among the six pages, the second code word is written to a third page and a fourth page among the six pages, and the third code word is written to a fifth page and a sixth page among the six pages.

7. The memory controller according to claim 1, wherein D bits stored in one memory cell are configured to correspond to different types of pages, and wherein the write control unit controls writing so that one code word is written to different types of pages.

8. A memory controller controlling a NAND memory having 2 bits/cell, comprising:

a code encoder which generates a code word having correction capability of t symbols by performing an error correction coding process based on an information data which is to be written in the NAND memory, where t is an integer of two or more;

a write control unit which controls writing of the code word to the NAND memory;

a read control unit which controls reading of the code word from the NAND memory;

a code decoder which decodes the code word read from the NAND memory; and a memory interface which performs writing to the NAND memory and reading from the NAND memory, wherein the write control unit writes, in adjacent word lines in a block of the NAND memory, code data to the NAND memory into four different pages for each word line, the data being formed from 4/t or more code words one code word among 4/t or more code words being written to t or less pages among the four pages, the four pages being included in B blocks of the NAND memory, where B is an integer of one or more, wherein N is code length of the code word and greater than t, and B is smaller than N/t, and wherein said code data in the four different pages forms a basis for error correction of the information data.

9. A storage device comprising:

a NAND memory having D bits/cell, where D is an integer of two or more;

a code encoder which generates a code word having correction capability of t symbols by performing an error correction coding process based on an information data which is to be written in the NAND memory, where t is an integer of two or more;

a write control unit which controls writing of the code word to the NAND memory;

a read control unit which controls reading of the code word from the NAND memory;

a code decoder which decodes the code word read from the NAND memory; and a memory interface which performs writing in to the NAND memory and reading from the NAND memory, wherein the write control unit writes, in adjacent word lines in a block of the NAND memory, code data to the NAND memory into 2×D different pages for each word line, the data being formed from 2×D/t or more code words, one code word among the 2×D/t or more code words being written to t or less pages among the 2×D pages, the 2×D pages being included in B blocks of the NAND memory, where B is an integer of one or more, wherein N is code length of the code word and greater than t, and B is smaller than N/t, and wherein said code data in the 2×D different pages forms a basis for error correction of the information data.

* * * * *